(12) United States Patent
Upadhyay et al.

(10) Patent No.: US 12,480,046 B2
(45) Date of Patent: Nov. 25, 2025

(54) METHOD OF SELECTIVELY ETCHING A METAL COMPONENT

(71) Applicant: Microsoft Technology Licensing, LLC, Redmond, WA (US)

(72) Inventors: Shivendra Upadhyay, Copenhagen (DK); Saulius Vaitiekenas, Copenhagen (DK); Charles Masamed Marcus, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/756,813

(22) PCT Filed: Dec. 5, 2019

(86) PCT No.: PCT/EP2019/083906
§ 371 (c)(1),
(2) Date: Jun. 2, 2022

(87) PCT Pub. No.: WO2021/110275
PCT Pub. Date: Jun. 10, 2021

(65) Prior Publication Data
US 2023/0008150 A1    Jan. 12, 2023

(51) Int. Cl.
*C09K 13/00* (2006.01)
*H01L 21/027* (2006.01)
*H01L 21/3213* (2006.01)

(52) U.S. Cl.
CPC .......... *C09K 13/00* (2013.01); *H01L 21/0272* (2013.01); *H01L 21/32134* (2013.01); *H01L 21/32139* (2013.01)

(58) Field of Classification Search
CPC ................ C09K 13/00; H01L 21/0272; H01L 21/32134; H01L 21/32139; C23F 1/02; C23F 1/32; C23F 1/36; H10N 60/01
(Continued)

(56) References Cited

U.S. PATENT DOCUMENTS

| | | |
|---|---|---|
| 4,904,980 A | 2/1990 | Przybysz |
| 5,084,437 A | 1/1992 | Talvacchio |

(Continued)

FOREIGN PATENT DOCUMENTS

| | | |
|---|---|---|
| AU | 2015282876 A1 | 2/2017 |
| CA | 2064362 A1 | 9/1992 |

(Continued)

OTHER PUBLICATIONS

Dow, Microposit™ MF™—321 Developer (Year: 2008).*
(Continued)

*Primary Examiner* — Duy Vu N Deo
(74) *Attorney, Agent, or Firm* — Klarquist Sparkman, LLP

(57) ABSTRACT

A method of selectively etching a metal component of a workpiece further comprising a ferromagnetic insulator component. The method comprises contacting the metal component with an etchant solution. The etchant solution comprises a basic etchant and a solvent. The method is useful in the context of the fabrication of semiconductor-superconductor-ferromagnetic insulator hybrid devices, for example. The etchant solution may not attack the ferromagnetic insulator component. Also provided is a composition for etching a metal, and a kit comprising the composition and a composition for depositing a styrene-acrylate co-polymer on a surface.

17 Claims, 8 Drawing Sheets

(58) Field of Classification Search
USPC .................. 438/694, 745, 754, 755; 216/83, 216/102–109
See application file for complete search history.

(56) References Cited

U.S. PATENT DOCUMENTS

| | | | |
|---|---|---|---|
| 5,696,392 | A | 12/1997 | Char |
| 10,224,475 | B2 | 3/2019 | Cybart |
| 10,665,701 | B2 | 5/2020 | Freedman et al. |
| 10,692,010 | B2 | 6/2020 | Freedman et al. |
| 10,879,464 | B2 | 12/2020 | Krogstrup Jeppesen et al. |
| 11,024,792 | B2 | 6/2021 | Ramakers et al. |
| 11,088,312 | B2 | 8/2021 | Schueffelgen |
| 11,380,836 | B2 | 7/2022 | Holmes et al. |
| 11,678,590 | B2 | 6/2023 | Schueffelgen |
| 12,171,147 | B2 | 12/2024 | Gardner |
| 12,275,921 | B2* | 4/2025 | Takahashi ......... H01L 21/02244 |
| 2003/0027724 | A1 | 2/2003 | Rose |
| 2003/0194867 | A1* | 10/2003 | Kudelka ........... H01L 21/30604 438/689 |
| 2006/0012000 | A1* | 1/2006 | Estes ..................... H10N 60/10 257/E29.241 |
| 2007/0059645 | A1* | 3/2007 | Tang ..................... H10K 10/82 430/311 |
| 2013/0037895 | A1 | 2/2013 | Lee et al. |
| 2018/0248103 | A1 | 8/2018 | Ivry |
| 2020/0227636 | A1 | 7/2020 | Krogstrup et al. |
| 2021/0126180 | A1 | 4/2021 | Winkler et al. |
| 2021/0126181 | A1 | 4/2021 | Winkler et al. |
| 2021/0175408 | A1 | 6/2021 | Gardner et al. |
| 2021/0324271 | A1* | 10/2021 | Eto ................... H01L 21/30604 |
| 2022/0149262 | A1 | 5/2022 | Gardner et al. |
| 2022/0282156 | A1* | 9/2022 | Narita ............... H01L 21/02063 |
| 2023/0012371 | A1 | 1/2023 | Krogstrup Jeppesen et al. |

FOREIGN PATENT DOCUMENTS

| | | |
|---|---|---|
| CN | 1252398 A | 3/2004 |
| CN | 101971273 A | 2/2011 |
| CN | 106575667 A | 4/2017 |
| CN | 106663691 A | 5/2017 |
| CN | 108364951 A | 8/2018 |
| CN | 109314174 A | 2/2019 |
| CN | 109804477 A | 5/2019 |
| EP | 0968979 A1 | 1/2000 |
| EP | 3351658 A1 | 7/2018 |
| JP | S6224677 A | 2/1987 |
| JP | 2002094370 A | 3/2002 |
| JP | 2009048778 A | 3/2009 |
| JP | 2010232562 A | 10/2010 |
| JP | 2019532506 A | 11/2019 |
| KR | 20120050235 A | 5/2012 |
| KR | 101535386 B1 | 7/2015 |
| KR | 20190033634 A | 3/2019 |
| KR | 20190040061 A | 4/2019 |
| WO | 2015017659 A1 | 2/2015 |
| WO | 2017217960 A1 | 12/2017 |
| WO | 2018052424 A1 | 3/2018 |
| WO | 2018171823 A1 | 9/2018 |
| WO | 2019099171 A3 | 5/2019 |
| WO | WO-2019151141 A1 * | 8/2019 ............... C23F 1/10 |
| WO | 2021093977 A1 | 5/2021 |

OTHER PUBLICATIONS

"AR-P 6200 (CSAR 62)", Retrieved from: http://web.archive.org/web/20190807053946/https://www.allresist.com/csar-62-ar-p-6200/, Aug. 7, 2019, 1 Page.

Stanescu, et al., "Majorana Fermions in Semiconductor Nanowires", In Journal of Physical Review B, vol. 84, Issue 14, Oct. 28, 2011, 29 Pages.

"Nano™ MC PMMA and Copolymer", Retrieved from: https://kayakuam.com/wp-content/uploads/2019/09/PMMA_Data_Sheet.pdf, Sep. 2019, 8 Pages.

Alicea, Jason, "Majorana Fermions in a Tunable Semiconductor Device", In the Repository of arXiv:0912.2115v1, Dec. 10, 2009, 10 Pages.

Shabani, et al., "Two-dimensional Epitaxial Superconductor-Semiconductor Heterostructures: A Platform for Topological Superconducting Networks", In Journal of Physical Review B, vol. 93, Issue 15, Apr. 1, 2016, 6 Pages.

Sau, et al., "Generic New Platform for Topological Quantum Computation Using Semiconductor Heterostructures", In Journal of Physical Review Letters, vol. 104, Issue 4, Jan. 27, 2010, 4 Pages.

Tinkham, Michael, "Introduction to Superconductivity", In Publication McGraw Hill, Inc., 1996, 472 Pages.

Winkler, et al., "Unified Numerical Approach to Topological Semiconductor-Superconductor Heterostructures", In Journal of Physical Review B, vol. 99, Issue 24, Jun. 13, 2019, 14 Pages.

Court, et al., "Energy gap measurement of nanostructured thin aluminium films for use in single Cooper-pair devices", In Journal of Superconductor Science and Technology, vol. 21, No. 1, Nov. 27, 2007, 9 Pages.

Vaitiekėnas, et al., "Selective-Area-Grown Semiconductor-Superconductor Hybrids: A Basis for Topological Networks", In Journal of Physical Review Letters, vol. 121, Issue 14, Oct. 3, 2018, 5 Pages.

Chang, et al., "Hard Gap in Epitaxial Semiconductor-Superconductor Nanowires", In Journal of Nature Nanotechnology vol. 10, Issue 3, Mar. 2015, pp. 232-236.

Cherkez, et al., "Proximity Effect between Two Superconductors Spatially Resolved by Scanning Tunneling Spectroscopy", In Journal of Physical Review X, vol. 4, No. 1, Mar. 11, 2014, 13 Pages.

Drachmann, et al., "High-critical-field superconducting heterostructures using anodic oxidation", In Proceedings of the APS March Meeting, Mar. 4, 2019, 01 Page.

Drachmann, "Proximity Effect Transfer from NbTi into a Semiconductor Heterostructure via Epitaxial Aluminum", In Journal of Nano Letters, vol. 17, Issue 2, Jan. 10, 2017, 8 Pages.

Evertsson, et al., "The thickness of native oxides on aluminum alloys and single crystals", In Journal of Applied Surface Science, Sep. 15, 2015, pp. 826-832.

Housecroft, et al., "Chapter 15: The group 15 elements", In Book of Inorganic Chemistry, Pearson Inc, 2008, pp. 433-489.

Kittel, Charles, "Introduction to Solid State Physics", In Publication of John Wiley & Sons, 2005, 700 Pages.

Naergaard, et al., "Quantized Conductance Doubling and Hard Gap in a Two-Dimensional Semiconductor-Superconductor Heterostructure", In Journal of Nature communications, vol. 7, Issue 1, Sep. 29, 2016, 6 Pages.

Krizek, et al., "Field effect enhancement in buffered quantum nanowire networks", In Journal of Physical Review Materials, vol. 2, Issue 9, Sep. 7, 2018, 08 Pages.

Wolf, et al., "Fabrication and magnetic characterization of nanometer-size ellipses of the ferromagnetic insulator EuS", In Journal of Magnetism and Magnetic Materials, vol. 368, May 9, 2014, pp. 49-53.

Krogstrup, et al., "Epitaxy of Semiconductor-Superconductor Nanowires", In Journal of Nature Materials, vol. 14, Issue 4, Apr. 2015, pp. 400-406.

Liu, et al., "Semiconductor—Ferromagnetic Insulator—Superconductor Nanowires: Stray Field and Exchange Field", In Repository of arXiv:1910.03364v1, Oct. 8, 2019, 29 Pages.

Ocola, et al., "Development Characteristics of Polymethyl Methacrylate in Alcohol/Water Mixtures: A Lithography and Raman Spectroscopy Study", In Journal of Nanotechnology, vol. 27, Issue 3, Dec. 9, 2015, 13 Pages.

Oreg, et al., "Helical Liquids and Majorana Bound States in Quantum Wires", In Journal of Physical Review Letter, vol. 105, Issue 17, Oct. 20, 2010, 4 Pages.

Pauka, et al., "Repairing the Surface of InAs-based Topological Heterostructures", In Repository of arXiv:1908.08689v1, Aug. 23, 2019, 7 Pages.

"International Search Report and Written Opinion Issued in PCT Application No. PCT/EP2019/083906", Mailed Date: Jul. 22, 2020, 14 Pages.

(56) References Cited

OTHER PUBLICATIONS

"International Search Report and Written Opinion Issued in PCT Application No. PCT/US20/063459", Mailed Date: Mar. 12, 2021, 11 Pages.

"International Search Report and Written Opinion Issued in PCT Application No. PCT/EP19/083904", Mailed Date: Oct. 7, 2020, 12 Pages.

Linder, et al., "Majorana Fermions Manifested as Interface-States in Semiconductor Hybrid Structures", In the Repository of arXiv:1004.3786v1, Apr. 21, 2010, 4 Pages.

Wu, et al., "Chiral Majorana Fermion Edge States in a Heterostructure of Superconductor and Semiconductor With Spin-Orbit Coupling", In The Journal of Physics: Conference Series, vol. 393, Jul. 9, 2012, 6 pages.

Grosfeld, et al., "Observing Majorana Bound States of Josephson Vortices in Topological Superconductors", In the Repository of arXiv:1012.2492v2, Aug. 18, 2011, 10 Pages.

Notice of Allowance mailed on Feb. 27, 2024, in U.S. Appl. No. 17/561,330, 9 pages.

Communication under Rule 71(3) EPC Received for European Application No. 20830437.8, mailed on Apr. 17, 2024, 7 pages.

Notice of Allowance Received for Korea Application No. 10-2022-7017934, mailed on Apr. 25, 2024, 8 pages (English Translation Provided).

"Non Final Office Action Issued in U.S. Appl. No. 17/561,330", Mailed Date: Oct. 6, 2023, 19 Pages.

"Notice of Allowance Issued in European Patent Application No. 19817246.2", Mailed Date: Aug. 10, 2023, 7 Pages.

He, et al., "Chiral Majorana fermion modes in a quantum anomalous Hall insulator-superconductor structure", In Journal of Science, vol. 357, Issue 6348, Jul. 21, 2017, 8 Pages.

Zhang, et al., "Quantized Majorana Conductance", INature, vol. 556, Issue 7699, Apr. 5, 2018, 14 Pages.

U.S. Appl. No. 16/796,671 / US-2021-0175408-A1 /U.S. Pat. No. 11,211,543, filed Feb. 20, 2020 / Jun. 10, 2021 / Dec. 28, 2021.

U.S. Appl. No. 17/561,330 / US-2022-0149262-A1, filed Dec. 23, 2021 / May 12, 2022.

U.S. Appl. No. 17/756,815 / US-2023-0012371-A1, filed Jun. 2, 2022 / Jan. 12, 2023.

Intention to Grant received for European Application No. 20830437.8, mailed on Nov. 15, 2023, 7 Pages.

Office Action Received for Korean Application No. 10-2022-7017934, mailed on Jan. 22, 2024, 7 pages (with English translation).

Office Action Received in Japanese Application No. 2022-533642, mailed on Nov. 14, 2023, 7pages (English Translation Provided).

Decision to Grant Received for Japan Application No. 2022-533642, mailed on May 7, 2024, 5 pages.

Office Action Received for Indian Application No. 202247030042, mailed on May 1, 2024, 6 pages.

Decision to Grant Received for European Application No. 20830437.8, mailed on Aug. 8, 2024, 2 pages.

Office Action Received for Chinese Application No. 201980102748.3, mailed on Aug. 7, 2024, 9 pages. (English Translation Provided).

Office Action Received for Japanese Application No. 2022-530890, mailed on Sep. 10, 2024, 10 pages (English Translation Provided).

Extended European Search Report and Written Opinion received for PCT Application No. 24160621.9, Jun. 21, 2024, 6 pages.

Notice of Allowance mailed on Jul. 31, 2024, in U.S. Appl. No. 17/561,330, 8 pages.

Communication pursuant to Article 94(3) received for PCT Application No. 24160621.9, Dec. 20, 2024, 05 pages.

Decision to grant a European patent pursuant to Article 97(1) Received for European Application No. 19817246.2, mailed on Jan. 5, 2024, 02 pages.

Duddles, et al., "Control of nitrogen incorporation in ZnTe: N grown by molecular-beam epitaxy using Ar dilution in a N plasma source", In Journal of applied physics, vol. 76, Issue No. 9, Nov. 1, 1994, pp. 5214-5217.

Notice of Allowance mailed on Aug. 25, 2021, in U.S. Appl. No. 16/796,671, 09 pages.

Office Action Received for Korean Application No. 10-2022-7021272, mailed on Nov. 22, 2024, 08 pages. (English translation Provided).

Communication under Rule 71(3) Received in European Patent Application No. 19817248.8, mailed on Jan. 16, 2025, 08 pages.

Decision to grant for Japanese Application No. 2022530890,mailed on Jan. 28, 2025, 6 pages. (English Translation Provided).

First Office Action Received for Chinese Application No. 202080084194.1, mailed on Feb. 13, 2025, 16 Pages (English Translation Provided).

Extended European Search Report received for European Application No. 25169961.7, Mailed on Jul. 17, 2025, 10 pages.

\* cited by examiner

METHOD OF SELECTIVELY ETCHING A METAL COMPONENT

CROSS REFERENCE TO RELATED APPLICATIONS

This is the U.S. National Stage of International Application No. PCT/EP2019/083906 filed Dec. 5, 2019, which was published in English under PCT Article 21(2), which is incorporated herein in its entirety.

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to, or below, a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce MZMs, the device is cooled to a temperature where the superconductor (e.g. aluminium, Al) exhibits superconducting behaviour. The superconductor causes a proximity effect in the adjacent semiconductor, whereby a region of the semiconductor near the interface with the superconductor also exhibits superconducting properties. Topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. The g-factor refers to the coefficient between the applied magnetic field and the spin splitting. Typically, the magnetic field is applied by an external electromagnet.

An alternative route to creating topological materials and superconducting memory elements that does not require external magnetic (Zeeman) field involves combinations of semiconducting, superconducting, and ferromagnetic insulator materials hybridized into a single device. These systems have been proposed theoretically [Sau, et al., PRL 104, 040502 (2010)].

U.S. Ser. No. 16/246,287 has also disclosed a heterostructure in which a layer of a ferromagnetic insulator is disposed between the superconductor and semiconductor in order to internally apply the magnetic field for lifting the spin degeneracy, without the need for an external magnet. U.S. Ser. No. 16/246,287 indicates that an exchange field between the ferromagnetic insulator and the semiconductor causes a split in energy levels. Examples given for the ferromagnetic insulator included compounds of heavy elements in the form of EuS, EuO, GdN, $Y_3Fe_5O_{12}$, $Bi_3Fe_5O_{12}$, $YFeO_3$, $Fe_2O_3$, $Fe_3O_4$, $Sr_2CrReO_6$, $CrBr_3/CrI_3$, $YTiO_3$ (the heavy elements being Europium, Gadolinium, Yttrium, Iron, Strontium and Rhenium).

The fabrication of nanowire heterostructures comprising InAs and Al layers has been reported [Krogstrup, et al., Nat. Mater. 14, 400 (2015)].

SUMMARY

Provided is a method of selectively etching a metal component of a workpiece further comprising a ferromagnetic insulator component. The method comprises contacting the metal component with an etchant solution. The etchant solution comprises a basic etchant and a solvent.

Also provided is a composition for etching a metal, comprising tetramethyl ammonium hydroxide and a solvent. The solvent comprises a mixture of water and propan-2-ol. The water is present in the solvent in an amount in the range 3% to 10% by weight based on the total weight of the solvent.

Further provided is a kit comprising the composition and a composition for depositing a styrene-acrylate co-polymer on a surface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 3a is a scanning electron microscopy, SEM, micrograph of a nanowire having structural motifs as in FIG. 1a;

FIG. 7b shows an SEM micrograph of a portion of the nanowire obtained in Example 5 at higher magnification than in FIG. 7a.

DETAILED DESCRIPTION OF EMBODIMENTS

Figure 1A:
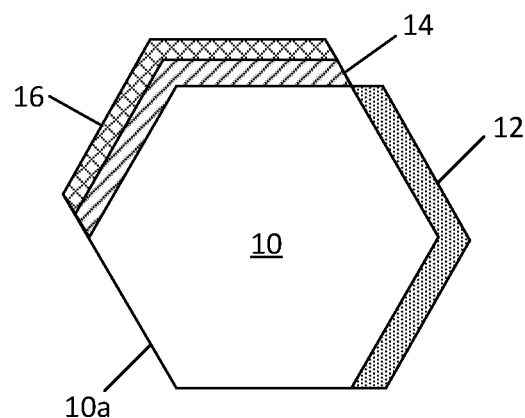
FIG. 1a is a schematic cross-section of a first illustrative type of workpiece.

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the device when viewed in the orientation illustrated in FIGS. 1 and 2. For the avoidance of any doubt, this terminology is not intended to limit the orientation of the device in an external frame of reference.

As used herein, the term "superconductor" refers to a material which becomes superconductive when cooled to a temperature below a critical temperature, Tc, of the material. Likewise, a "ferromagnetic insulator" is a material which is ferromagnetic when cooled to a temperature below the Curie temperature of the material. The use of these terms is not intended to limit the temperature of the device.

A "nanowire" as referred to herein is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths are typically of the order of micrometers, e.g. at least 1 µm, or at least 10 µm. In the present context, the nanowires are typically formed of a semiconductor material.

The term "workpiece" may refer in particular to an unfinished device obtained after one or more fabrication steps. The method of etching a metal provided herein may form part of a method of fabricating a device, in particular a semiconductor-superconductor-ferromagnetic insulator hybrid device.

The content of all documents cited herein is hereby incorporated by reference in its entirety.

It is desirable to allow fabrication of devices comprising a combination of semiconductor, superconductor, and ferromagnetic insulator components, wherein that the superconductor is present only at selected positions. This is because electrostatic gating of such devices may allow certain phenomena having applications in quantum computing to be induced. Superconductor materials may block electrostatic fields. Electrostatic gating may be impossible if a device is fully coated with superconductor material.

Selective deposition of materials using a directional deposition process in combination with hollow shadow walls is described in U.S. patent application Ser. No. 16/258,025.

Provided herein is a method of etching a metal which is useful in the context of fabricating a semiconductor-superconductor-ferromagnetic insulator hybrid device.

Structural motifs which may be present in workpieces during the manufacture of semiconductor-superconductor-ferromagnetic insulator devices will now be described with reference to FIG. 1. It should be noted that these structures are illustrative, and that the methods provided herein may be applied to other device topologies.

Figure 1B:
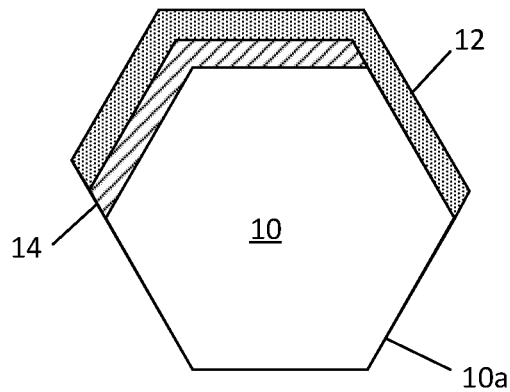
FIG. 1b is a schematic cross-section of a second illustrative type of workpiece.
Figure 2:
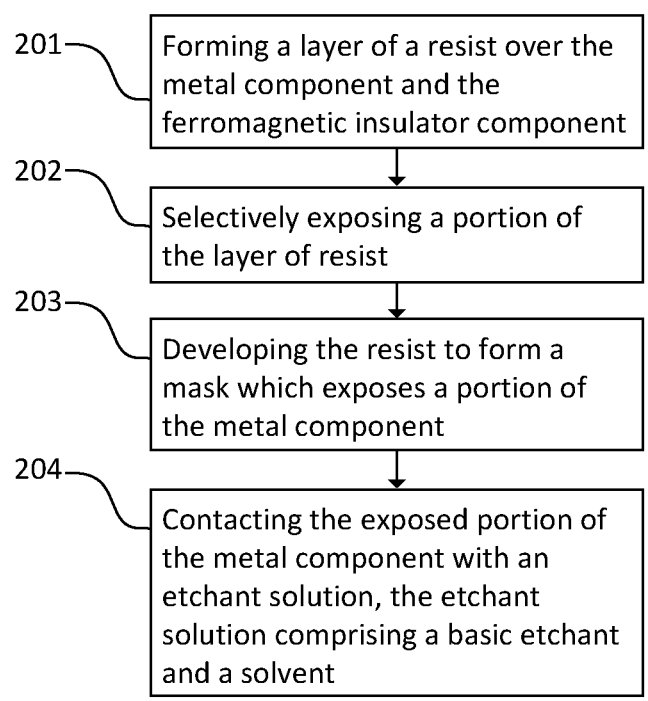
FIG. 2 is a flow chart outlining an illustrative method of etching a metal.

FIGS. 1a and 1b each include a semiconductor component 10. Semiconductor component 10 is in the form of a nanowire. The illustrated nanowires have hexagonal cross-sections, with components arranged on various side-facets of the nanowires.

Nanowires are typically arranged on a wafer, which supports the nanowire. The nanowire may be formed integrally with the wafer.

The nature of the material which forms the semiconductor component is not particularly limited. For example, the semiconductor component may comprise a III-V semiconductor. Examples of useful III-V semiconductor materials include those of general formula:

where x is in the range 0 to 1. In other words, semiconductor component 10 may comprise indium antimonide (x=0), indium arsenide (x=1), or a ternary mixture comprising 50% indium on a molar basis and variable proportions of arsenic and antimony (0<x<1).

Indium arsenide, InAs, has been found to have good handling properties, and provides devices with good performance. Indium antimonide, InSb, may provide further improvements to device performance but may have less favourable handling properties. The ternary mixtures have intermediate properties between those of the binary compounds InAs and InSb. Improvements in device performance compared to InAs may be observed when x is in the range 0 to 0.7, or 0.01 to 0.7. Values of x in the range 0.35 to 0.45 may provide a particularly good balance of device performance and handling properties.

The semiconductor component may comprise indium arsenide. As components of hybrid devices may be fabricated by epitaxial growth processes, good lattice matching between component materials may be desirable. Indium arsenide has good compatibility with aluminium and europium sulfide in particular.

Another example semiconductor material is indium phosphide. Indium phosphide has a band gap which is much greater than that of the materials of Formula 1. Indium phosphide is one example which may form a wafer for supporting a nanowire of a further semiconductor material.

A workpiece may include one or more exposed portions of semiconductor 10a. For example, etching a superconductor component may expose a portion of semiconductor. In such examples, it would be desirable to avoid damage to the semiconductor during etching.

FIGS. 1a and 1b further show a superconductor component 12. In FIG. 1a, superconductor component 12 is arranged directly on the semiconductor component 10.

In FIG. 1b, superconductor component 12 is arranged over the semiconductor component 10, with a ferromagnetic insulator component 14 arranged between the semiconductor component 10 and the superconductor component 12. Some workpieces might include a combination of these two types of structural element.

A wide range of superconductor materials may be encountered. The superconductor component typically comprises an s-wave superconductor. Examples of superconductor materials include aluminium, niobium, lead, indium, and tin.

Aluminium is one material of particular interest. For example, a superconductor component may comprise aluminium and may have a thickness in the range 3 to 10 nm, optionally 4 to 10 nm. Winkler et al (Physical Review B 99, 245408 (2019)) report that aluminium couples strongly to InAs and InSb, and that the strength of the coupling may vary depending on the thickness of the superconductor layer. This effect may be observed for other semiconductor components according to Formula 2.

FIG. 1a further shows a ferromagnetic insulator component 14 arranged on the semiconductor component 10. Typical thicknesses for such components might be in the range 2 to 10 nm.

FIG. 1a further shows that the ferromagnetic insulator component is capped by a protective layer 16. Protective layer 16 may comprise aluminium oxide, for example. In a variant of the FIG. 1a arrangement, a superconductor component may be provided on the protective layer 16.

FIG. 1b, in contrast, shows an arrangement in which a ferromagnetic insulator component 14 is covered by a superconductor component 12, without the presence of a protective layer 16 over the ferromagnetic insulator component 14.

An example method of etching a metal selectively in the presence of a ferromagnetic insulator will now be described with reference to FIG. 2.

At block 201, a layer of resist is formed over a workpiece comprising a metal component and a ferromagnetic insulator component. The workpiece may further include a semiconductor component.

Forming the layer of resist optionally includes applying an adhesion promoter to the workpiece before applying the layer of resist. Adhesion promoters for lithography are commercially available.

The layer of resist may be applied using any suitable technique. One useful example is spin-coating.

The resist may be an electron beam resist. Example resists are discussed in further detail hereinbelow.

At block 202, a portion of the layer of resist is selectively exposed. Exposure causes material in the exposed portion of the resist to undergo a reaction which alters the solubility of the resist in a developer.

The nature of the exposure is selected as appropriate based on the nature of the resist. For example, if the resist is an electron beam resist then the exposure will be to an electron beam. Electron beam lithography is particularly useful in the context of manufacturing devices for quantum computing applications, because it may allow for higher resolution than alternative techniques such as photolithography.

The portions of the layer of resist to be exposed are selected based on the desired device structure, and also on the nature of the resist. The resist may be a positive resist. A positive resist becomes less soluble in the developer where exposed. The resist may be a negative resist. A negative resist becomes more soluble in the developer where exposed.

At block 203, the resist is developed to form a mask which exposes a portion of the metal component.

Developing the resist comprises removing portions of the resist by contacting the resist with one or more solvents.

At block 204, the exposed portion of the metal component is contacted with an etchant solution, the etchant solution comprising a basic etchant and a solvent.

The etchant solution etches metal from the exposed portions of the metal component, which in the context of fabrication of a semiconductor-superconductor-ferromagnetic insulator hybrid device will be the superconductor component. It is desirable to remove only the exposed portions, with as little etching as possible of portions of the metal component covered by the mask. Precise control over the final configuration of the metal component is desired, as this may improve properties of the finished device. It is further desirable to avoid or minimise decomposition of the ferromagnetic insulator component and semiconductor component. Although the ferromagnetic insulator component and the semiconductor component may be metal-containing compounds, the etchant suitably does not extract metal from these compounds.

Further discussion of the etchant solution is provided below.

EXAMPLES

The following examples illustrate various methods of etching metals, in the context of constructing a semiconductor-superconductor-ferromagnetic insulator hybrid device.

In each of these examples, the semiconductor was indium arsenide, the superconductor was aluminium, and the ferromagnetic insulator was europium sulfide. The semiconductor was arranged in the form of a nanowire. Protective insulator layers, where present, comprised aluminium oxide.

Example 1 (a Comparative Example)

The method of Example 1 is based on a method developed for semiconductor-superconductor hybrid structures and reported by Chang et al (Nature Nanotech 10, 232-236 (2015)). The method of the present example differs from these reported methods principally in that the hybrid structure further includes a ferromagnetic insulator component.

Figure 3A:
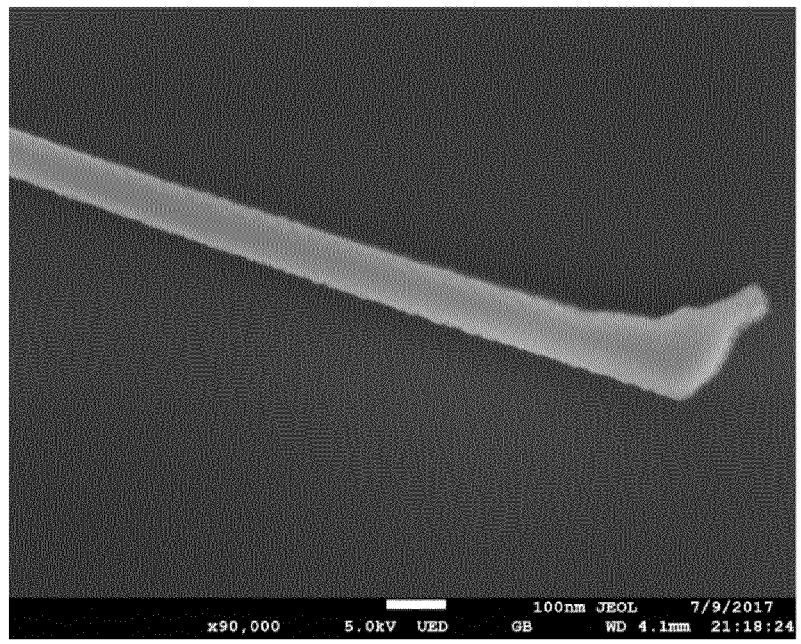

A workpiece including a nanowire of the type illustrated in FIG. 1a arranged on a silicon wafer capped by an insulating silicon oxide layer was fabricated by growing the nanowire on an indium arsenide substrate and then transferring the nanowire to the capped silicon wafer. An SEM micrograph of the workpiece is shown in FIG. 3a.

A layer of a commercially-available adhesion promoter "AR 300-80" was spin coated onto the workpiece. A layer of a commercially-available resist, MMA(8.5)MAA EL9 supplied by Microchem, was then spin-coated. The layer of resist comprised a methyl methacrylate-methacrylic acid co-polymer in ethyl lactate. The amount of methyl methacrylate was 8.5 wt % based on the total weight of the co-polymer. Etch windows in the layer of resist were opened via electron beam lithography, forming a mask.

The resulting workpiece was submerged in a commercially-available acid-based aluminium etchant, Transene-D, at 50° C. for 8 s. Transene-D is a composition comprising 5 to 10 wt % sodium-m-nitrobenzene sulfonate, 55 to 65 wt % phosphoric acid, 1 to 5% acetic acid, and 20 to 39% distilled water by weight based on the total weight of the composition.

After the etching, the workpiece was rinsed in de-ionized water. A further rinse in 1,3 di-oxolane for 5 minutes was performed for resist stripping.

Figure 3B:
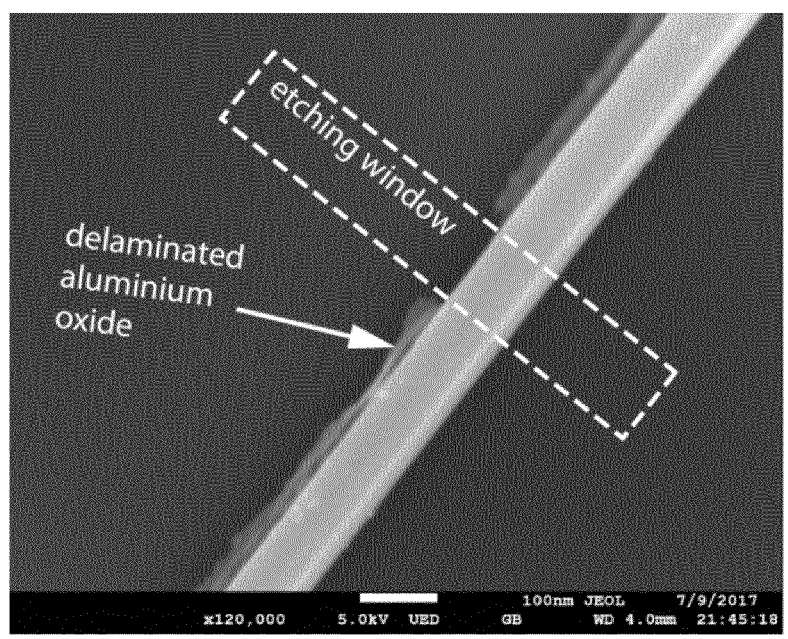
FIG. 3b is an SEM micrograph of the nanowire of FIG. 3a, after etching using the method of Example 1.

The etchant was found to attack the ferromagnetic insulator and to delaminate the protective AlOx layer, as shown in FIG. 3b.

Example 2

The method of Example 2 differs from that of Example 1 principally in that a basic etchant solution was used to etch the aluminium. The basic etchant solution was a 0.2 M aqueous solution of tetramethyl ammonium hydroxide, TMAH.

A resist was applied to a workpiece as in Example 1. Electron beam lithography was used to define etch windows in the mask.

The resultant workpiece was submerged in the etchant solution for 90 s. The etching was terminated by rinsing the workpiece in deionised, DI, water.

Figure 4A:
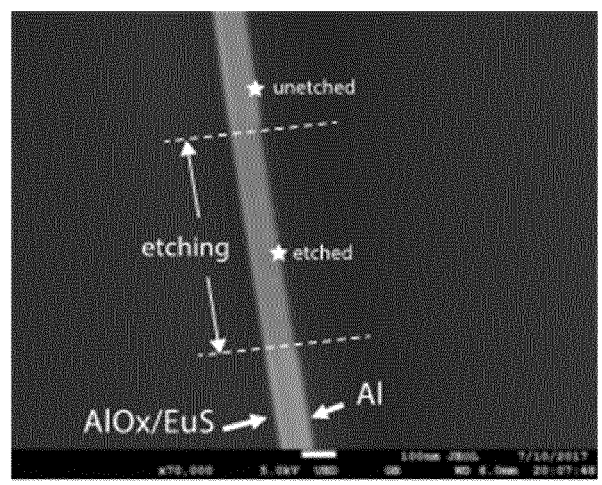
FIG. 4a is an SEM micrograph of the nanowire obtained in Example 2.
Figure 4B:
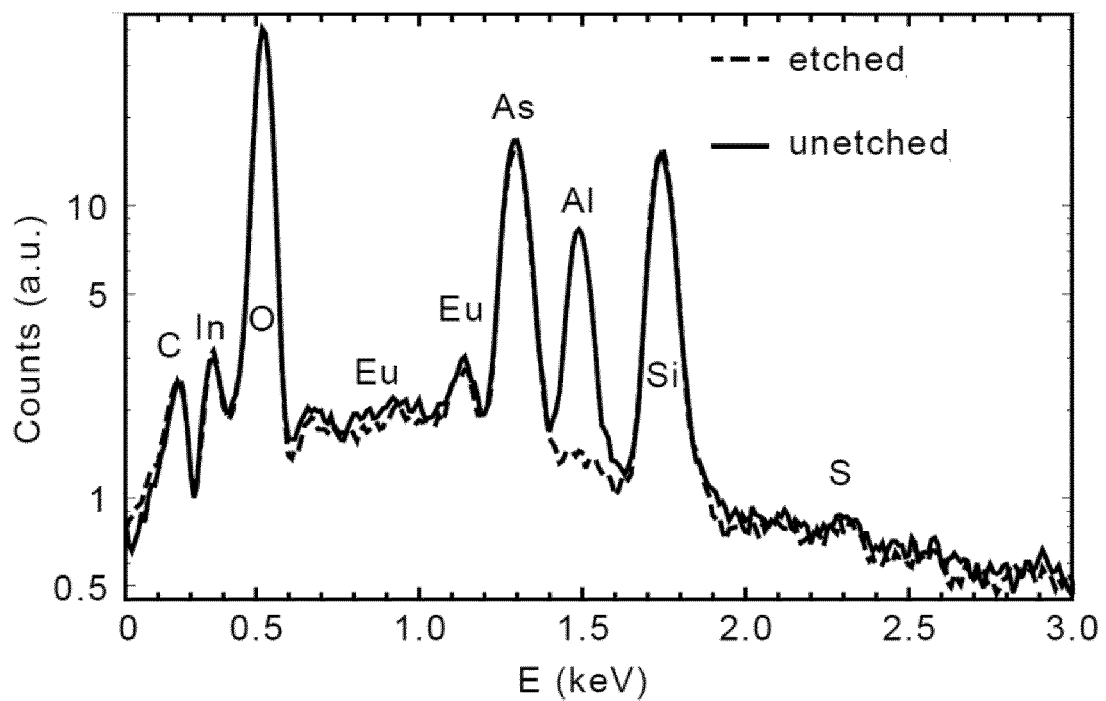
FIG. 4b shows energy dispersive x-ray spectroscopy, EDS, spectra of the nanowire shown in FIG. 4a, at etched and unetched positions.

The etching results are summarized in FIGS. 4a and 4b. FIG. 4a shows that the etch is clean. No delamination of the aluminium oxide protective layer is visible in the SEM image. The EDS spectra shown in FIG. 4b indicate that both Eu and S stay unaltered by the etching, whereas the Al shell is completely removed from the targeted part of the wire.

Example 3

The method of Example 2 was applied to a workpiece comprising a nanowire of the type shown in FIG. 1b arranged on a substrate.

Figure 5:
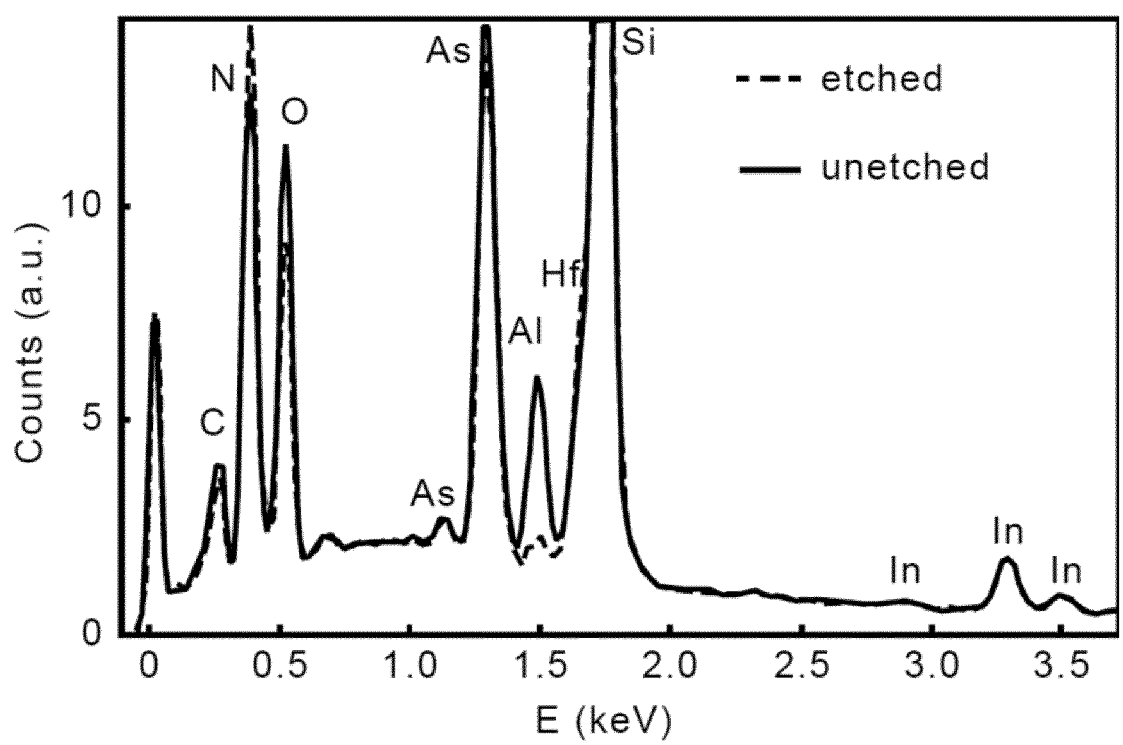
FIG. 5 shows EDS spectra obtained in Example 3.

Although selective removal of aluminium at the desired segment of the wire was achieved, the ferromagnetic insulator was decomposed throughout the whole nanowire. This is illustrated in FIG. 5, which shows EDS spectra at etched and unetched positions of the nanowire. No Eu or S peaks are present.

Example 4

To prevent the decomposition of the ferromagnetic insulator shell, the 0.2 M aqueous TMAH etchant solution used in Examples 2 and 3 was diluted in propan-2-ol (isopropyl alcohol, IPA). The dilution ratio was 1:19 by volume, resulting in a 10 mM solution of TMAH. Dilution of the TMAH etchant slows down the etching process.

A resist was applied and electron beam lithography was performed in the same manner as in Examples 1 to 3, forming a mask.

The resulting workpiece was dipped in the etching solution for 3 minutes and then rinsed in IPA for 10 s.

After rinsing in 1,3 di-oxolane for 5 minutes for resist stripping, a further IPA rinse was performed. This further rinse is not believed to have any impact on the properties of the product obtained.

Figure 6:
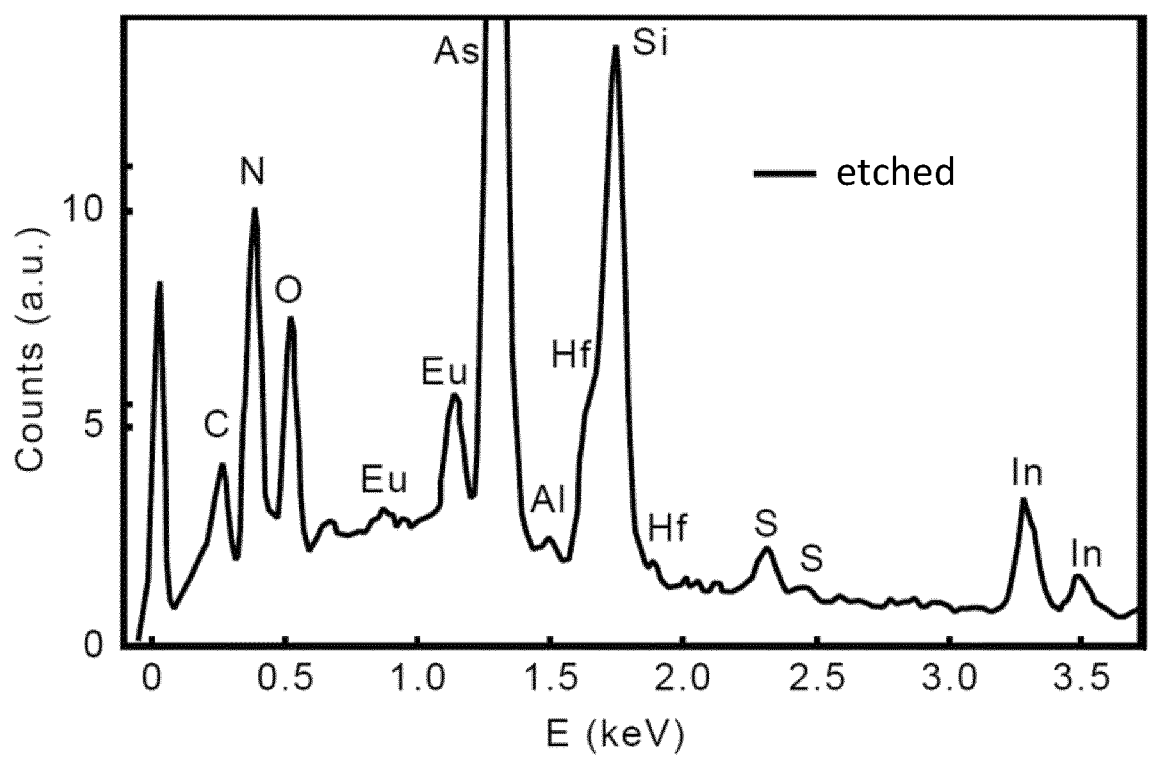
FIG. 6 shows EDS spectra obtained in Example 4.

FIG. 6 shows an EDS of an etched region of the workpiece obtained. The etchant solution etches Al efficiently, and leaves the EuS shell undamaged.

However, it was found that the method of the present example results in an etch run under the resist. The aluminium is etched beyond the etch openings.

The combined results of Example 3 and Example 4 suggest that DI water attacks the ferromagnetic insulator. In Example 3, where a high concentration of DI water was present in the etchant composition, the EuS signal is gone for both etched and unetched regions, as shown in FIG. 5. In Example 4, where the concentration of water was lower due to the inclusion of propan-2-ol, EuS is present while Al is efficiently removed as shown in FIG. 6.

Furthermore, an IPA:water mixture is reported to be a developer for certain electron beam resists [Ocola, et al., Nanotechnology 27 035302 (2016)]. The etchant solution used in the present example included 5% water by volume. This is believed to be enough to attack the methyl methacrylate-methacrylic acid co-polymer mask itself, resulting in the over-etching of the aluminium.

Example 5

To address the issue of the polymer mask being attacked by the etchant solution, a different polymer resist, CSAR, was used. CSAR is a commercially-available composition comprising poly($\alpha$-methylstyrene-co-methyl chloroacrylate), an acid source, in an anisole solvent. The composition deposits a resist comprising poly($\alpha$-methylstyrene-co-methyl chloroacrylate).

The method of Example 5 was otherwise similar to that of Example 4.

A CSAR 13% coating was applied, and exposed to the electron beam. The exposed resist was then developed in o-Xylene for 30 seconds.

The workpiece was then dipped in a 1:3 methyl isobutyl ketone:IPA solution for 5 s; the ratio being by volume. This step is optional, but may result in cleaner development of the resist.

After the developing, the workpiece is rinsed in IPA for 10 seconds.

For etching, the workpiece is dipped in the 0.2 M solution of TMAH in 1:19 IPA as described in Example 4 for 3 minutes.

After the etching, the workpiece is rinsed in IPA for 10 seconds. The resist is stripped by placing the workpiece in 1,3 di-oxolane for 5 minutes. The workpiece is cleaned by a 10 second rinse in IPA.

Figure 7A:
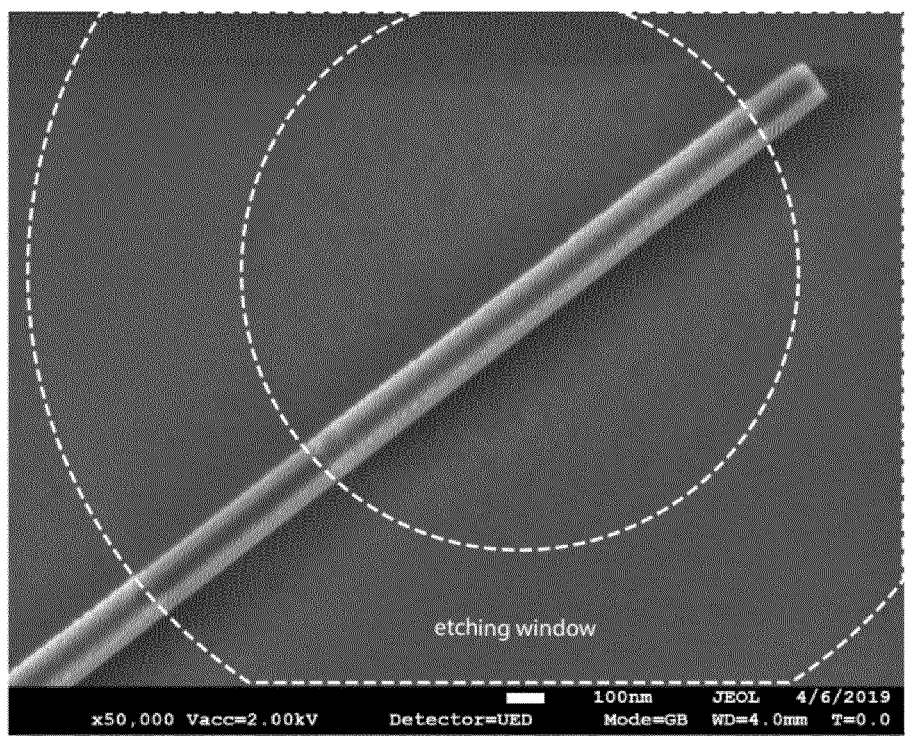
FIG. 7a shows an SEM micrograph of the nanowire obtained in Example 5.
Figure 7B:
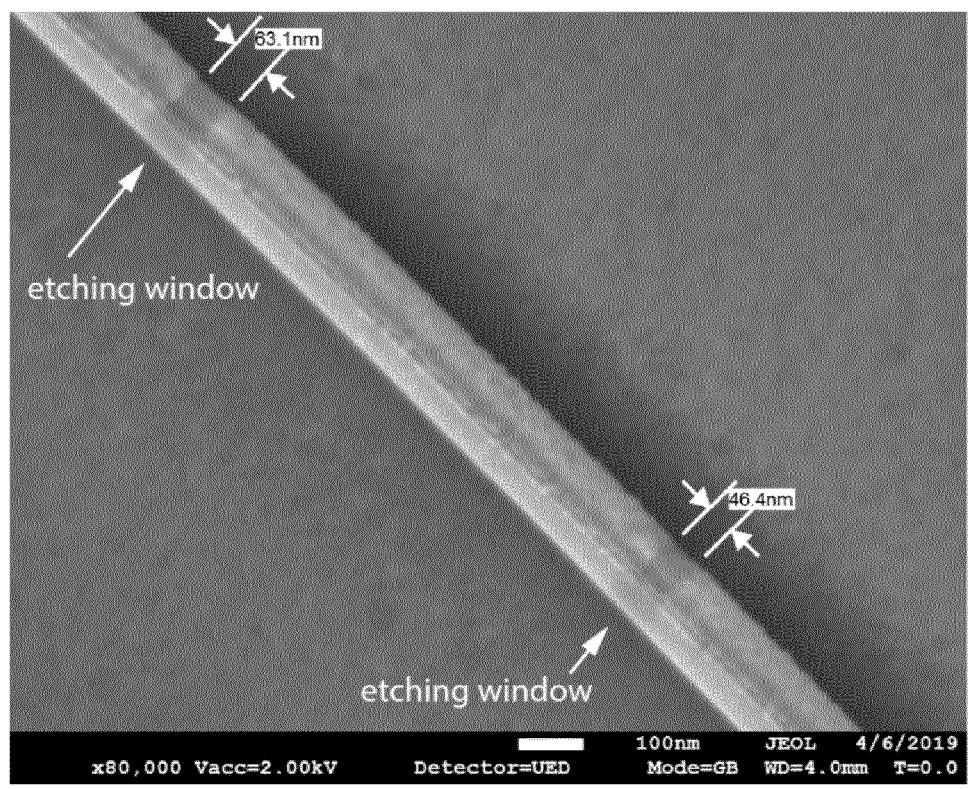

SEM micrographs of nanowires obtained by this method are shown in FIGS. 7a and 7b. FIG. 7a shows a large area, clean etching. FIG. 7b shows high-resolution etching. Windows having a size of approximately 45 nm were successfully obtained. This resolution is difficult to obtain using the comparative method of Example 1.

Figure 7C:
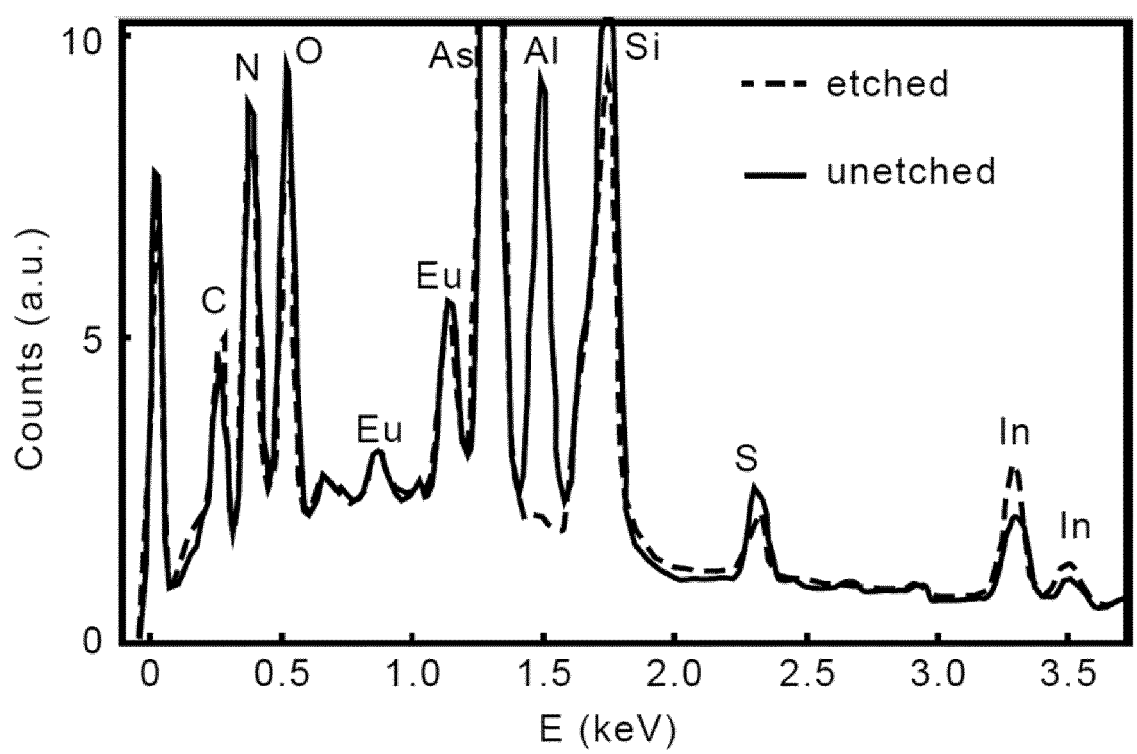
FIG. 7c shows EDS spectra at etched and un-etched positions of the product shown in FIG. 7b.

FIG. 7c shows EDS of etched and unetched portions of the nanowire obtained in this example. The spectra show that the Al shell is removed selectively from the target regions. The EuS shell remains undamaged in both the etched and unetched sections.

It will be appreciated that the above embodiments have been described by way of example only.

More generally, according to one aspect disclosed herein, there is provided a method of selectively etching a metal component of a workpiece further comprising a ferromagnetic insulator component, which method comprises:

contacting the metal component with an etchant solution;

wherein the etchant solution comprises a basic etchant and a solvent. It has been found that the use of a basic etchant may allow the selective etching of a metal component without decomposition of the ferromagnetic insulator component.

The ferromagnetic insulator may comprise a material selected from europium sulfide and europium oxide.

The ferromagnetic insulator component may, in particular, comprise europium sulfide. The Examples reported hereinabove were practiced using europium sulfide. Europium oxide has a similar structure and properties to europium sulfide, and is expected to show similar behaviour to that of the latter.

Europium sulfide and europium oxide are considered ferromagnetic insulator materials in the present context because they display ferromagnetism when cooled sufficiently, even if ferromagnetism is not necessarily observed at room temperature.

The basic etchant may be a compound of Formula 1:

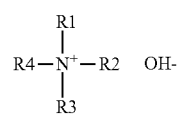

wherein R1 to R4 are each independently selected C1 to C6 alkyl groups. For example, the basic etchant may be tetramethyl ammonium hydroxide. Tetramethyl ammonium hydroxide has been investigated in particular.

The solvent may comprise water. The solvent may comprise a mixture of water and a C1 to C5 alkanol. The C1 to C5 alkanol may be propan-2-ol.

The water may be present in an amount in the range 3% to 10%, optionally 4 to 8%, or 4.4 to 5.4% or about 4.9% by weight based on the total weight of the solvent. The inclusion of water in the etchant solution has been found to enhance the etching ability of the solution. High concentrations of water may damage the ferromagnetic insulator component if no protective layer is included in the workpiece, and in such examples the amount of water preferably does not exceed about 10%.

In examples where the ferromagnetic insulator component is covered by the protective layer of e.g. aluminium oxide, high concentrations of water are well-tolerated and there is no upper limit on the amount of water in the etchant solution.

The concentration of basic etchant is not particularly limited. The rate of etching may vary depending on the concentration of basic etchant. The basic etchant may be present in the etchant solution at a concentration in the range 5 mM to 40 mM, 5 to 20 mM, 15 mM to 25 mM, or 5 mM to 15 mM. Concentrations in the range 5 to 20 mM may provide a relatively slow rate of etching, which may allow for greater control over the etch.

The metal which forms the metal component may be selected from aluminium, gallium, and indium. Aluminium has been investigated in particular.

The time for which the workpiece is contacted with the etchant solution may be selected as appropriate, depending on desired thickness of the etch, the concentration of the etchant solution, and the temperature at which the etching is performed.

The workpiece may further comprise a protective layer arranged on the ferromagnetic insulator component. The protective layer may comprise aluminium oxide, hafnium oxide, or a silicon oxide, for example. Of these, aluminium oxide may be preferred for some applications. The inclusion of a protective layer may allow for the use of a wider range of basic etchants and/or may protect the ferromagnetic insulator component from exposure to water.

The workpiece may further comprise a semiconductor component. The nature of the semiconductor component is not particularly limited. For the construction of semiconductor-superconductor-ferromagnetic insulator hybrid devices, III-V semiconductors may be of interest. For example, the semiconductor component may comprise a material of Formula 2:

where x is in the range 0 to 1.

The semiconductor component may, for example, comprise indium arsenide. The examples reported herein were practiced using indium arsenide nanowires, and no degradation of the indium arsenide was observed.

Other materials of Formula 1 are structurally-similar to indium arsenide and are expected to show the same behaviour. Further examples of materials of Formula 1 include those wherein x is in the range 0 to 0.7, or 0.01 to 0.7. Values of x in the range 0.35 to 0.45 may be preferred for certain devices.

The configuration of the semiconductor component is not particularly limited. The semiconductor component may be in the form of a nanowire. The nanowire may be formed integrally to a wafer, for example a nanowire obtainable by selective area growth. Alternatively, the nanowire may be fabricated separately and subsequently placed on a wafer. Techniques for growing nanowires include the vapour-liquid-solid epitaxial growth method.

More than one semiconductor component may be present. For example, the target device may comprise a nanowire arranged on a wafer, in which case the wafer and nanowire may each comprise different semiconductor materials.

Indium phosphide is one example semiconductor useful as a wafer material. A silicon wafer, for example a silicon wafer capped by a silicon oxide layer, is another illustrative example.

The method may further comprise, before the contacting:
forming a layer of resist over the metal component and the ferromagnetic insulator component;
selectively exposing a portion of the layer of resist; and developing the resist to form a mask which exposes a portion of the metal component.
Providing a mask allows for patterning of the metal component, as opposed to removing the metal component in its entirety.

The resist is typically an electron beam resist. Alternatively, a photoresist may be used. Generally, electron beam lithography has higher resolution than photolithography so may be preferred for some applications. The nature of the exposing and developing steps is selected as appropriate depending on the nature of the resist.

Forming the layer of resist may comprise spin-coating the workpiece with the resist, for example. Any suitable alternative technique may be used.

In examples where the ferromagnetic insulator component is covered by a protective layer, the nature of resist is not particularly limited.

The electron beam resist may be an acrylate polymer, for example poly(methylmethacrylate) or a methylmethacrylate-methacrylic acid copolymer. The methylmethacrylate may be present in the copolymer in an amount in the range 5 to 15%, optionally 7 to 10%, further optionally 8 to 9%, or about 8.5% by weight based on the total weight of the polymer.

In examples where the ferromagnetic insulator component is not covered by a protective layer, the use of a resist comprising a styrene-acrylate co-polymer may be preferred. The resist may comprise a styrene-haloacrylate copolymer. For example, the resist may comprise a poly(alpha-methylsyrene-co-methyl chloroacrylate), or an ester thereof, such as a methyl ester or ethyl ester. Another example polymer is a copolymer of α-chloromethacrylate and α-methylstyrene, at a number ratio of 1:1±25%. Resists in these classes are particularly preferably used in combination with an etchant solution comprising TMAH, water, and propan-2-ol.

The resist may comprise a material obtainable by a reaction of an acid with a poly(alpha-methylsyrene-co-methyl chloroacrylate), for example, the reaction of an acid with a poly(alpha-methylsyrene-co-methyl chloroacrylate) in an anisole solvent.

A poly(alpha-methylsyrene-co-methyl chloroacrylate) co-polymer was used in Example 5, and was found to be effective for masking a ferromagnetic insulator component from the etchant. This co-polymer is not developed by a mixture of propan-2-ol and water, and allows for high resolution etching when used in combination with etchant solutions based on a propan-2-ol/water solvent mixture.

The method may further comprise, after the developing, rinsing the mask and the portion of the metal with an organic solvent. Preferably, contact of the workpiece with water is avoided and any rinsing steps are instead performed using an organic solvent. This applies in particular to examples where no protective layer is present.

Another aspect provides a composition for etching a metal, comprising tetramethyl ammonium hydroxide and a solvent, wherein the solvent comprises a mixture of water and propan-2-ol; and wherein the water is present in the solvent in an amount in the range 3% to 10% by weight based on the total weight of the solvent. It has been found that, by using a composition comprising a mixture of TMAH, water, and isopropyl alcohol, metals such as aluminium may be effectively etched.

For example, the water may be present in the solvent in an amount in the range 4 to 6% by weight based on the total weight of the solvent.

The tetramethyl ammonium hydroxide may be present at a concentration in the range 5 mM to 20 mM. The rate of etching varies depending on the concentration of tetramethyl ammonium hydroxide. Concentrations in this range may provide a relatively slow etch, e.g. 1-4 nm/minute for an aluminium component when the etching is performed at 25° C. Slow etching may be advantageous for some applications, as it may allow for a higher level of control and resolution.

A related aspect provides the use of a composition comprising tetramethylammonium hydroxide, water, and propan-2-ol to etch a metal.

The composition may be as described above with reference to the composition aspect.

The metal may be aluminium.

The use may be to etch the metal selectively, in the presence of a ferromagnetic insulator component and/or a semiconductor component. The ferromagnetic insulator component and/or semiconductor component may be as described hereinabove, with reference to the method aspect.

The use may be in a method of lithography, in conjunction with a mask comprising either a poly(alpha-methylsyrene-co-methyl chloroacrylate) co-polymer or a product obtainable by the reaction of an acid with a poly(alpha-methyl-syrene-co-methyl chloroacrylate) in an anisole solvent.

A still further aspect provides a kit comprising the composition for etching a metal as defined above and a composition for depositing a styrene-acrylate co-polymer on a surface. The styrene-acrylate co-polymer may comprise a styrene-haloacrylate copolymer. For example, the styrene-acrylate co-polymer may comprise a poly(alpha-methyl-syrene-co-methyl chloroacrylate), or an ester thereof, such as a methyl ester or ethyl ester. Another example styrene-acrylate co-polymer is a copolymer of α-chloromethacrylate and α-methylstyrene, at a number ratio of 1:1±25%.

In particular, the styrene-acrylate co-polymer may be poly(alpha-methylstyrene-co-methylchloroacrylate).

An example composition for depositing a poly(alpha-methylstyrene-co-methylchloroacrylate) on a surface comprises a poly(alpha-methylstyrene-co-methylchloroacrylate) an acid, and anisole. Such compositions are commercially available under the trade name "CSAR".

The combination of the composition for etching a metal and the composition for depositing a styrene-acrylate co-polymer on a surface may be advantageous because the composition for etching the metal may not attack styrene-acrylate copolymers such as poly(alpha-methylstyrene-co-methylchloroacrylate).

Other variants or use cases of the disclosed techniques may become apparent to the person skilled in the art once given the disclosure herein. The scope of the disclosure is not limited by the described embodiments but only by the accompanying claims.

The invention claimed is:

1. A method of selectively etching a metal component of a workpiece comprising a ferromagnetic insulator component situated on a semiconductor component, the metal component having a least a first portion situated on the semiconductor component, the method comprising:
   forming a layer of resist over the metal component and the ferromagnetic insulator component;
   developing the layer of resist to form a mask which exposes at least a portion of the metal component and an edge portion of the ferromagnetic insulator component;
   contacting the exposed portion of the metal component and the edge portion of the ferromagnetic insulator component with an etchant solution, wherein the etchant solution comprises a basic etchant and a solvent, thereby removing the exposed portion of the metal component while preserving the edge portion of the ferromagnetic insulator component.

2. The method according to claim 1, wherein the ferromagnetic insulator component comprises a material selected from europium sulfide and europium oxide.

3. The method according to claim 1, wherein the basic etchant is a compound of Formula 1:

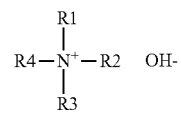

wherein R1 to R4 are each independently selected C1 to C6 alkyl groups.

4. The method according to claim 3, wherein the basic etchant is tetramethyl ammonium hydroxide.

5. The method according to claim 1, wherein the solvent comprises a mixture of water and a C1 to C5 alkanol.

6. The method according to claim 5, wherein the C1 to C5 alkanol is propan-2-ol.

7. The method according to claim 5, wherein the water is present in an amount in a range 3% to 10% by weight based on a total weight of the solvent.

8. The method according to claim 1, wherein the basic etchant is present in the etchant solution at a concentration in a range 5 to 20 mM.

9. The method according to claim 1, wherein the metal component comprises a metal selected from aluminium, gallium, and indium.

10. The method according to claim 9, wherein the metal is aluminium.

11. The method according to claim 1, wherein the workpiece further comprises a protective layer arranged on the ferromagnetic insulator component.

12. The method according to claim 11, wherein the protective layer comprises aluminium oxide.

13. The method according to claim 1, wherein the workpiece further comprises a semiconductor component; and
   wherein the semiconductor component comprises a material of a formula $InAs_xSb_{1-x}$, wherein x is in a range 0 to 1.

14. The method according to claim 13, wherein the semiconductor component comprises indium arsenide.

15. The method according to claim 1, further comprising, before the contacting:
   forming a layer of resist over the metal component and the ferromagnetic insulator component;
   selectively exposing a portion of the layer of resist; and
   developing the layer of resist to form a mask which exposes a portion of the metal component.

16. The method according to claim 15, wherein the layer of resist comprises a methylmethacrylate-methacrylic acid copolymer.

17. The method according to claim 15, wherein the layer of resist comprises a poly(alpha-methylstyrene-co-methyl chloroacrylate).

\* \* \* \* \*